US011600580B2

(12) United States Patent
Kroetz et al.

(10) Patent No.: US 11,600,580 B2
(45) Date of Patent: Mar. 7, 2023

(54) REPLACEABLE END EFFECTOR CONTACT PADS, END EFFECTORS, AND MAINTENANCE METHODS

(71) Applicant: Applied Materials, Inc., Santa Clara, CA (US)

(72) Inventors: Whitney Kroetz, Round Rock, TX (US); Damon Keith Cox, Jarrell, TX (US); Leon Volfovski, Foster City, CA (US); Jeffrey C. Hudgens, San Francisco, CA (US); Balamurali Murugaraj, Bangalore (IN)

(73) Assignee: Applied Materials, Inc., Santa Clara, CA (US)

(*) Notice: Subject to any disclaimer, the term of this patent is extended or adjusted under 35 U.S.C. 154(b) by 324 days.

(21) Appl. No.: 16/798,997

(22) Filed: Feb. 24, 2020

(65) Prior Publication Data

US 2020/0273826 A1  Aug. 27, 2020

(30) Foreign Application Priority Data

Feb. 27, 2019 (IN) .............................. 201941007622

(51) Int. Cl.
*H01L 23/66* (2006.01)
*H01L 23/00* (2006.01)
(Continued)

(52) U.S. Cl.
CPC ........ *H01L 23/66* (2013.01); *H01L 21/67011* (2013.01); *H01L 21/67144* (2013.01);
(Continued)

(58) Field of Classification Search
CPC ......... H01L 21/68714; H01L 21/68707; H01L 21/6875; H01L 21/68757; H01L 23/66;
(Continued)

(56) References Cited

U.S. PATENT DOCUMENTS

| | | | | |
|---|---|---|---|---|
| 6,739,638 B1 * | 5/2004 | Yazawa | .................... | B25J 9/042 414/752.1 |
| 7,293,811 B2 * | 11/2007 | Bonora | ............... | H01L 21/6838 414/941 |

(Continued)

FOREIGN PATENT DOCUMENTS

| | | |
|---|---|---|
| EP | 1063683 A2 | 12/2000 |
| JP | 4740188 B2 | 8/2011 |

OTHER PUBLICATIONS

International Search Report and Written Opinion for Application No. PCT/US2020/019982, dated Jun. 19, 2020, 11 pages.

*Primary Examiner* — Glenn F Myers
(74) *Attorney, Agent, or Firm* — Lowenstein Sandler LLP

(57) ABSTRACT

Replaceable contact pads of end effectors are provided. The contact pads support substrates in electronic device manufacturing. The contact pad includes a contact pad head having a contact surface configured to contact a substrate, a shaft coupled to the contact pad head, the shaft including a shaft indent formed between an underside of the contact pad head and a shaft end, and a circular securing member received around the shaft and seated in the shaft indent and configured to secure the contact pad to the end effector body. End effectors including replaceable contact pads and maintenance methods are described, as are additional aspects.

20 Claims, 7 Drawing Sheets

(51) Int. Cl.
*H01L 21/687* (2006.01)
*H01L 21/67* (2006.01)

(52) U.S. Cl.
CPC ........ *H01L 21/68714* (2013.01); *H01L 24/49* (2013.01); *H01L 21/68707* (2013.01); *H01L 2223/6611* (2013.01); *H01L 2224/48195* (2013.01); *H01L 2224/48227* (2013.01); *Y10S 414/135* (2013.01)

(58) Field of Classification Search
CPC ............... H01L 24/49; H01L 21/67144; H01L 21/67011; H01L 2224/48227; H01L 2224/48195; H01L 2223/6611; Y10S 414/135; Y10S 414/141
See application file for complete search history.

(56) References Cited

U.S. PATENT DOCUMENTS

| | | | |
|---|---|---|---|
| 7,384,083 B2* | 6/2008 | Kent | H01L 21/6838 294/902 |
| 7,654,596 B2 | 2/2010 | Mantz | |
| 8,382,180 B2 | 2/2013 | Kanawade et al. | |
| 8,864,202 B1 | 10/2014 | Schrameyer | |
| 9,202,738 B2 | 12/2015 | Greenberg | |
| 9,425,076 B2 | 8/2016 | Greenberg | |
| 2004/0113444 A1 | 6/2004 | Blonigan et al. | |
| 2006/0181095 A1 | 8/2006 | Bonora et al. | |
| 2009/0236786 A1* | 9/2009 | Sanemasa | H01L 21/68707 269/58 |
| 2014/0306474 A1 | 10/2014 | Schrameyer | |
| 2015/0217456 A1* | 8/2015 | Tsuji | H01L 21/68707 156/273.1 |
| 2017/0040205 A1 | 2/2017 | Hiester et al. | |
| 2017/0323821 A1* | 11/2017 | Thanu | H01L 21/68707 |
| 2018/0311832 A1* | 11/2018 | Bosboom | H01L 21/6838 |

* cited by examiner

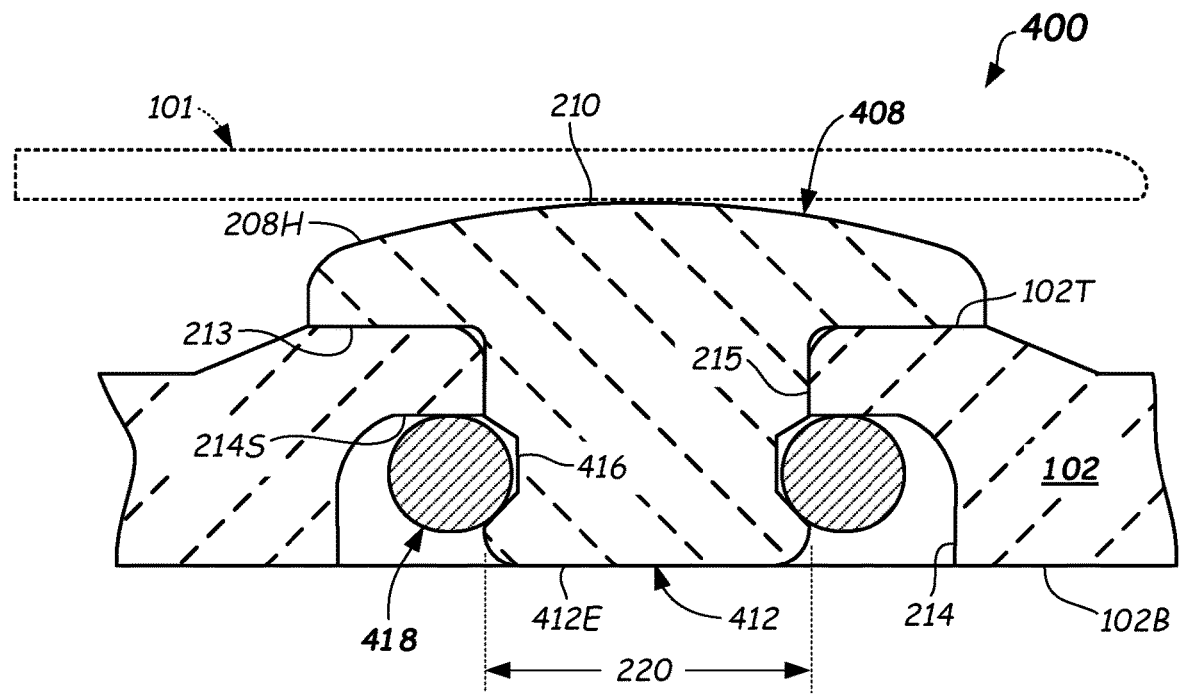
FIG. 4A
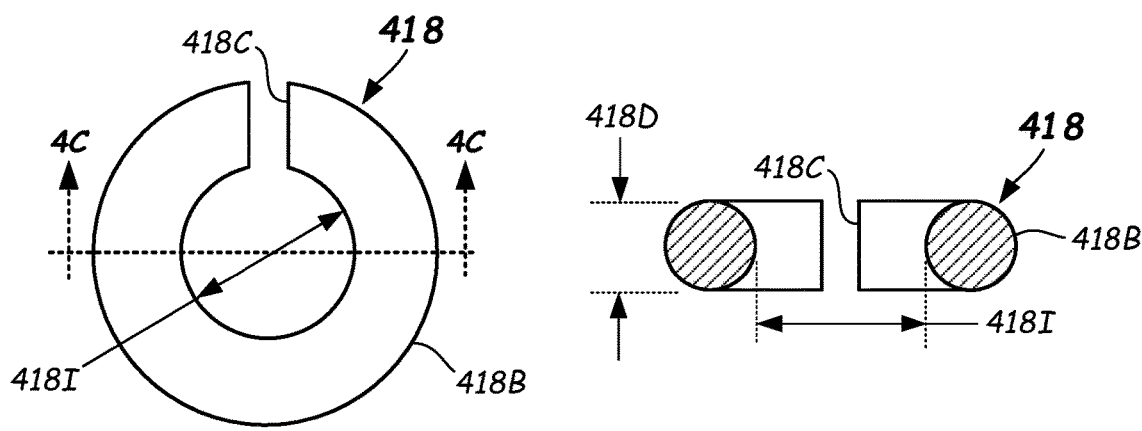
FIG. 4B
FIG. 4C

US 11,600,580 B2

REPLACEABLE END EFFECTOR CONTACT PADS, END EFFECTORS, AND MAINTENANCE METHODS

RELATED APPLICATIONS

This application claims the benefit of priority from Indian Patent Application No. 201941007622, filed Feb. 27, 2019, the disclosure of which is hereby incorporated by reference herein in its entirety.

FIELD

The present disclosure relates to electronic device manufacturing and, more specifically, end effector apparatus and methods of transporting substrates.

BACKGROUND

In electronic device manufacturing, substrates (e.g., silicon-containing wafers, silicon-containing plates) may be moved about manufacturing facilities and within manufacturing equipment tools by robots. The robots can include robot arms having one or more end effectors coupled thereto that may contact and support the substrates during such transportation. End effectors include contact pads thereon, usually three, that provide elevated contact surfaces upon which the substrates are supported.

SUMMARY

In a first aspect, an end effector is provided. The end effector is configured to support a substrate, and includes an end effector body having a top surface and a bottom surface, a recess extending into the body from the bottom surface, and an aperture formed in the body and extending between the top surface and the recess; a contact pad disposed on the end effector body, the contact pad further comprising a contact pad head having a contact surface configured to contact the substrate, and a shaft coupled to the contact pad head and received in the aperture and extending into the recess, the shaft including a shaft indent formed between an underside of the contact pad head and a shaft end; and a circular securing member received around the shaft and seated in the shaft indent to secure the contact pad to the end effector body.

In another aspect, a contact pad adapted to be secured to an end effector body of an end effector is provided. The contact pad includes a contact pad head having a contact surface configured to contact a substrate; a shaft coupled to the contact pad head, the shaft including a shaft indent formed between an underside of the contact pad head 108H and a shaft end; and a circular securing member received around the shaft and seated in the shaft indent and configured to secure the contact pad to the end effector body.

In method aspect, a method of maintaining an end effector adapted to transport a substrate in electronic device manufacturing is provided. The method includes providing an end effector body of the end effector having a top surface and a bottom surface, a recess extending into the end effector body from the bottom surface, and an aperture extending between the top surface and the recess; providing a contact pad having a contact pad head with a contact surface configured to contact and support the substrate, and a shaft coupled to the contact pad head, the shaft including a shaft indent formed between an underside of the contact pad head and a shaft end; providing a circular securing member; inserting the shaft through the aperture and into the recess; and securing the circular securing member around the shaft and seated in the shaft indent to secure the contact pad to the end effector body.

Other features and aspects of the present disclosure will become more fully apparent from the following detailed description, the appended claims, and the accompanying drawings.

BRIEF DESCRIPTION OF THE DRAWINGS

FIG. 4A illustrates a cross-sectional side view of a portion of an end effector including an example replaceable contact pad adapted for high temperature operation above 320° C. in accordance with an alternative embodiment of the present disclosure.

FIG. 4B illustrates a top plan view of a circular securing member comprising a circular, cut metal ring of FIG. 4A in accordance with the alternative embodiment of the present disclosure.

FIG. 4C illustrates a cross-sectional side view of the circular securing member taken along section 4C-4C of FIG. 4B and comprising a circular, cut metal ring of the replaceable contact pad in accordance with the alternative embodiment of the present disclosure.

DETAILED DESCRIPTION

In electronic device manufacturing processes, substrates (e.g., silicon wafers, silicon-containing plates, etc.) configured to produce electronic components (e.g., electronic chips or electronic subcomponents thereof) are moved, often via use of one or more robots, through a number of manufacturing steps. The robots include end effectors that support the substrates during such movements. Moving substrates very quickly can increase throughput and, consequently, can reduce manufacturing costs of the produced electronic components.

However, moving quickly can generate particles, when among other things, substrates slide on contact surfaces of the end effectors of the robot during transport. Thus, it is preferable to minimize substrate sliding on the end effector. To reduce sliding of the substrates, conventional end effectors have included integrally-machined contact pads. In particular, the integrally-machined contact pads have included domed contact surfaces with surface characteristics that contact and support the substrates and that also provide a low propensity for sliding. Each integrally-machined contact pad may have a machined contact surface with a particular domed profile and surface roughness, which may reduce the likelihood of a substrate sliding thereon. However, wear of the integrally-machined end effector contact pads and contamination thereof with silicon particles/dust can increase the propensity of the substrates to slide on the contact pads and thus can limit the useful life of the end effector. To prevent substrate sliding, the entire end effector is replaced periodically.

In accordance with embodiments of the present disclosure, replaceable contact pads are provided that can be rapidly changed out and replaced when worn. Thus, the overall cost of continuing to provide a low slide end effector is dramatically reduced.

These and other embodiments of end effectors with replaceable contact pads, replaceable contact pads, and methods of maintenance of an end effector are described below with reference to FIGS. 1-7.

Figure 1:
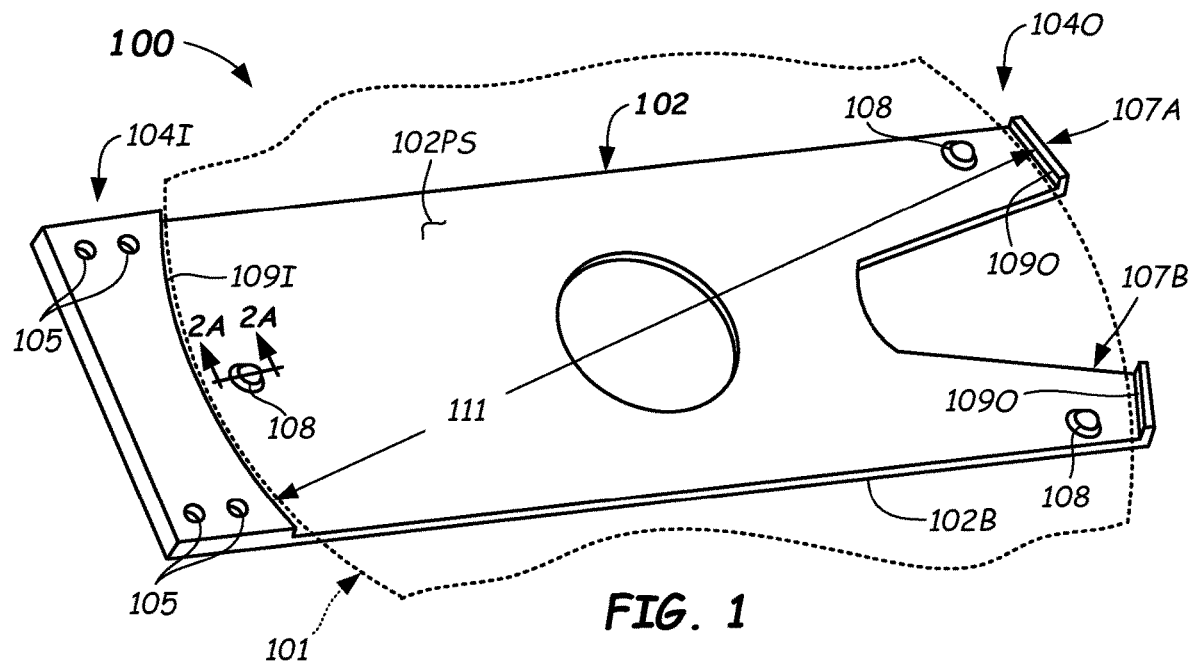
FIG. 1 illustrates a perspective view of an example of an end effector including one or more replaceable contact pads provided in accordance with embodiments of the present disclosure.

FIG. 1 depicts a first example embodiment of an end effector 100 configured to support a substrate 101 (a portion thereof shown dotted) including one or more contact pads 108 that are replaceable. In the depicted embodiment, the end effector 100 consists essentially of three contact pads 108. However, other embodiments may include other numbers of the contact pads 108.

The end effector 100 is made up of an end effector body 102 having a top surface 102T (FIG. 2A) and a bottom surface 102B. The top surface 102T may comprise a plane containing three spot faces that are raised above an underlying planar surface 102PS of the end effector body 102. The end effector body 102 is configured to couple or interconnect to a robot component at an inboard end 1041, such as to a third arm 653 (e.g., robot wrist—see FIG. 6). Coupling may be by way of fasteners (not shown) received through bores 105 thus coupling the end effector 100 to the third arm 653 (e.g., wrist member). Coupling may be made directly to the third arm 653 or through and intermediate component such as a mounting plate 654 (FIG. 6), as is described in U.S. Pat. No. 10,090,188, in order to reduce cracking of the end effector 100 when made from a ceramic or glass material.

An outboard end 1040 of the end effector body 102 can includes first fork 107A and second fork 107B, each of which can be configured to receive and support a contact pad 108 thereon. The contact pads 108 on the outboard end 1040 and a third contact pad 108 proximate the inboard end 1041 can provide for stable three-point contact supporting the substrate 101 thereon (only a portion of substrate 101 shown in FIGS. 1 and 2). Substrate 101 can be supported on the contact pads 108 of the end effector 100 between an inboard shelf 1091, which may be an arcuate step of approximately a same radius as the substrate 101, and outboard shelves 1090. Spacing between the respective inboard shelves 1091 and outboard shelves 1090 can be slightly larger (e.g., a few mm) than the substrate 101, such as where dimension 111 is a diameter that is slightly larger than 300 mm in diameter or 450 mm in diameter or other dimension of the substrate 101. Other configurations of the end effector body 102 other than shown can be used.

Figure 2A:
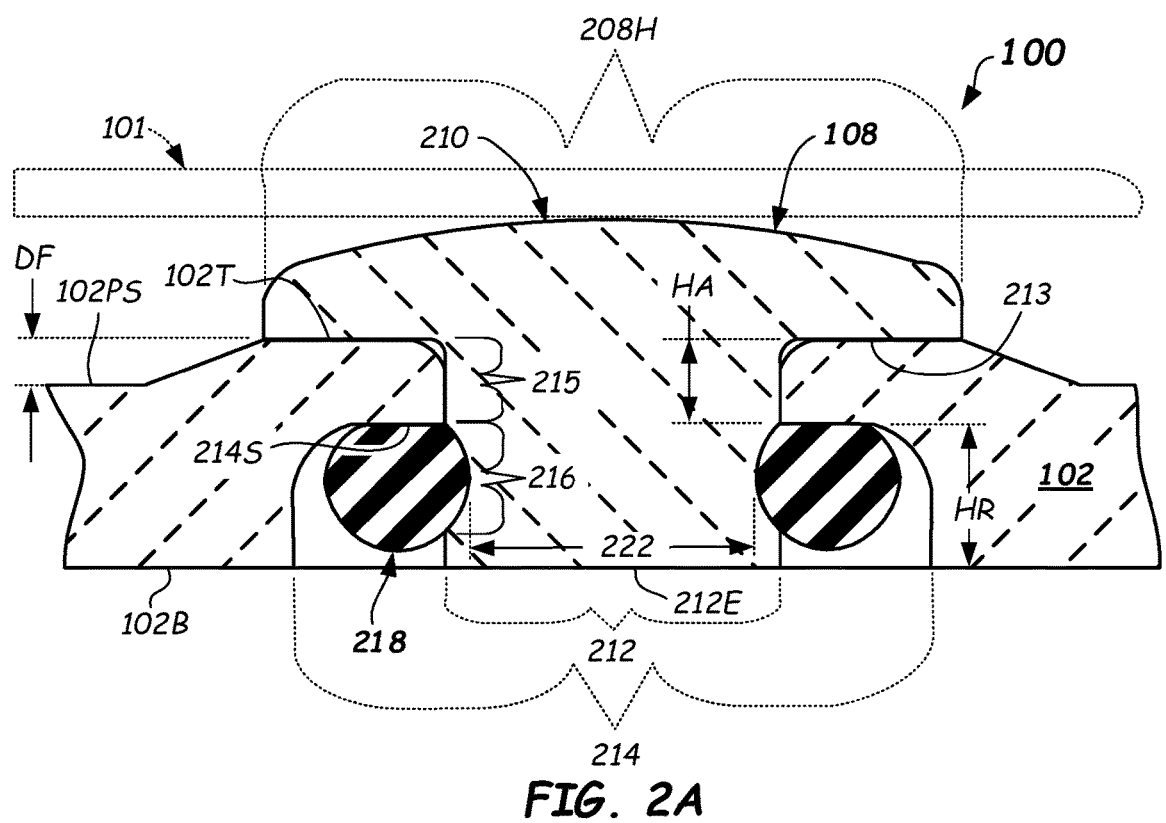
FIG. 2A illustrates a partial cross-sectional view taken along section 2A-2A of FIG. 1 of a portion of an end effector including a replaceable contact pad in accordance with some embodiments of the present disclosure.
Figure 2B:
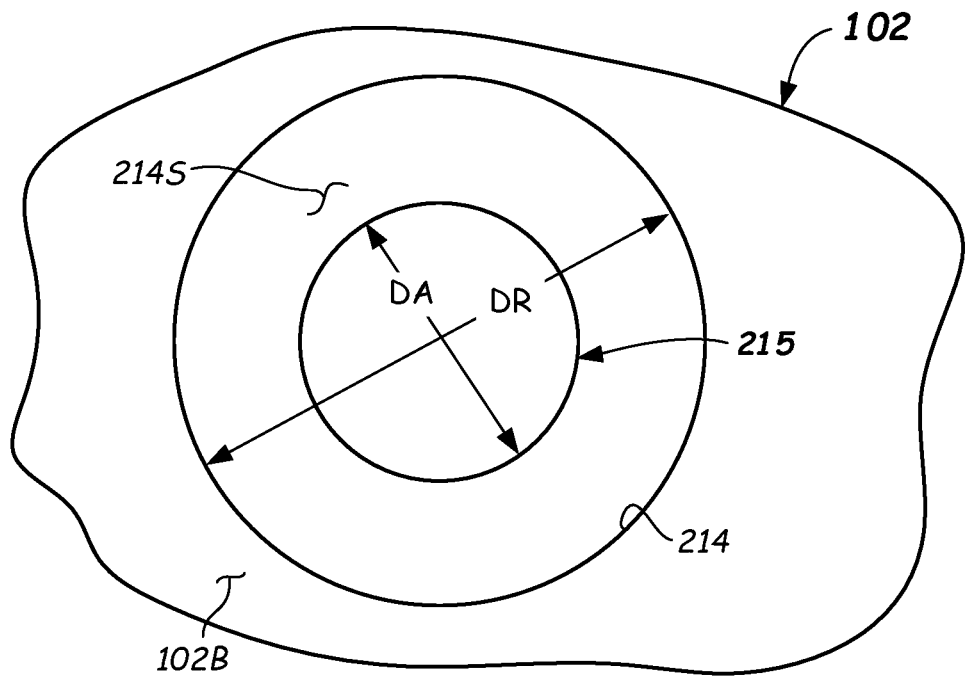
FIG. 2B illustrates a bottom view of a portion of the end effector of FIG. 2A illustrating the recess and aperture configured to receive the replaceable contact pad therein (with the replaceable contact pad removed for illustration purposes) in accordance with embodiments of the present disclosure.
Figure 2C:
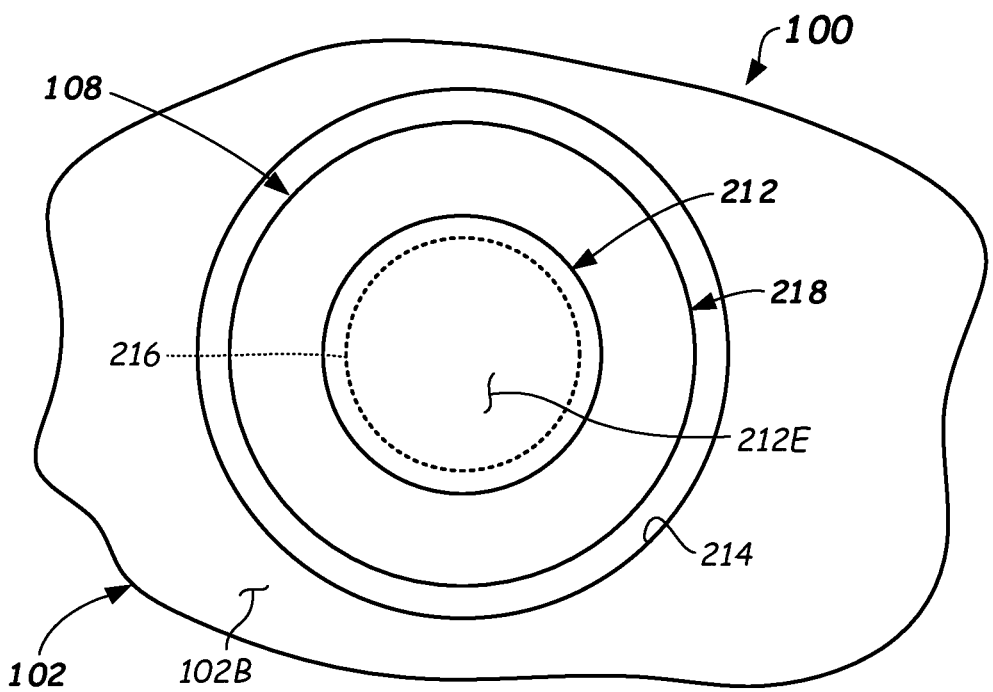
FIG. 2C illustrates a bottom view of a portion of an end effector of FIG. 2A illustrating the replaceable contact pad installed in the recess and aperture and secured with a circular securing member in accordance with embodiments of the present disclosure.

As best shown in FIGS. 2A-2C, the bottom surface 102B of the end effector body 102 includes a recess 214 formed therein. The recess 114 can be circular, and can extend into the end effector body 102 from the bottom surface 102B to a depth HR. An aperture 215 is formed in the end effector body 102 and extends between the top surface 102T and the recess 214. The recess 214 can have a recess diameter DR of from 5 mm and 10 mm, and a recess height HR of from 1.1 mm and 2.0 mm, for example. The aperture 215 can have an aperture diameter DA of from 2.8 mm and 4.8 mm, and an aperture height HA of from 0.85 mm and 1.1 mm, for example. Other diameters and heights and depths can be used. Each may be larger for use with substrates of 450 mm in diameter.

The end effector body 102 can be manufactured from a rigid material, such as a glass, ceramic, or metal material. For example, a ceramic such as alumina or a metal-doped ceramic, such as a metal-doped alumina can be used. Ti-doped alumina was found to be a good choice for high temperature applications above 320° C., where electrical conductivity of the end effector body 102 is wanted. However, the glass or ceramic materials can be used at lower temperatures also. In some embodiments, the end effector 100 can be used between 250° C. to 650° C., or even above 320° C. in some embodiments. Optionally, the end effector body 102 may be a metal, such as stainless steel or aluminum, for example. Other suitable metals or alloys can be used.

In more detail, a representative contact pad 108 will now be described. Referring now to FIG. 2A and FIGS. 2C through 3B, a contact pad 108 is shown disposed in the end effector body 102. The contact pad 108 includes a contact pad head 208H having a contact surface 210 that is configured to contact the substrate 101. The contact surface 210 can include a domed shape having a radius of curvature 21OR (FIG. 2D) of from 8 mm to 20 mm, for example. The contact surface 210 can have a surface roughness of from 45 μin Ra to 65 μin Ra per ASME B46.1 (2009). The contact pad head 208H can have a contact pad height HP of from 1.0 mm to 2.0 mm, for example. The contact pad head 208H can have a contact pad diameter DP of from 6.0 mm to 12.0 mm, for example. Other suitable contact surface dimensions, profiles, radiuses, and surface roughness can be used.

The contact pad 108 further includes a shaft 212 coupled to the contact pad head 208H and the shaft 212 is received in the aperture 215. Contact pad head 208H and the shaft 212 may be integrally formed as a one-piece component. The shaft 212 can further extend a distance DS from the underside 213 of the contact pad head 208H into the recess 214. The shaft 212 includes a shaft indent 216 formed therein. The shaft 212 should not extend below the bottom surface 102B of the end effector body 102 so as not to interfere with substrate placement. The shaft indent 216 may be provided in the form of a groove (e.g., an annular groove) and may be formed in the shaft 212 at a location between the underside 213 of the contact pad head 208H and the shaft end 212E of the shaft 112.

Figure 2D:
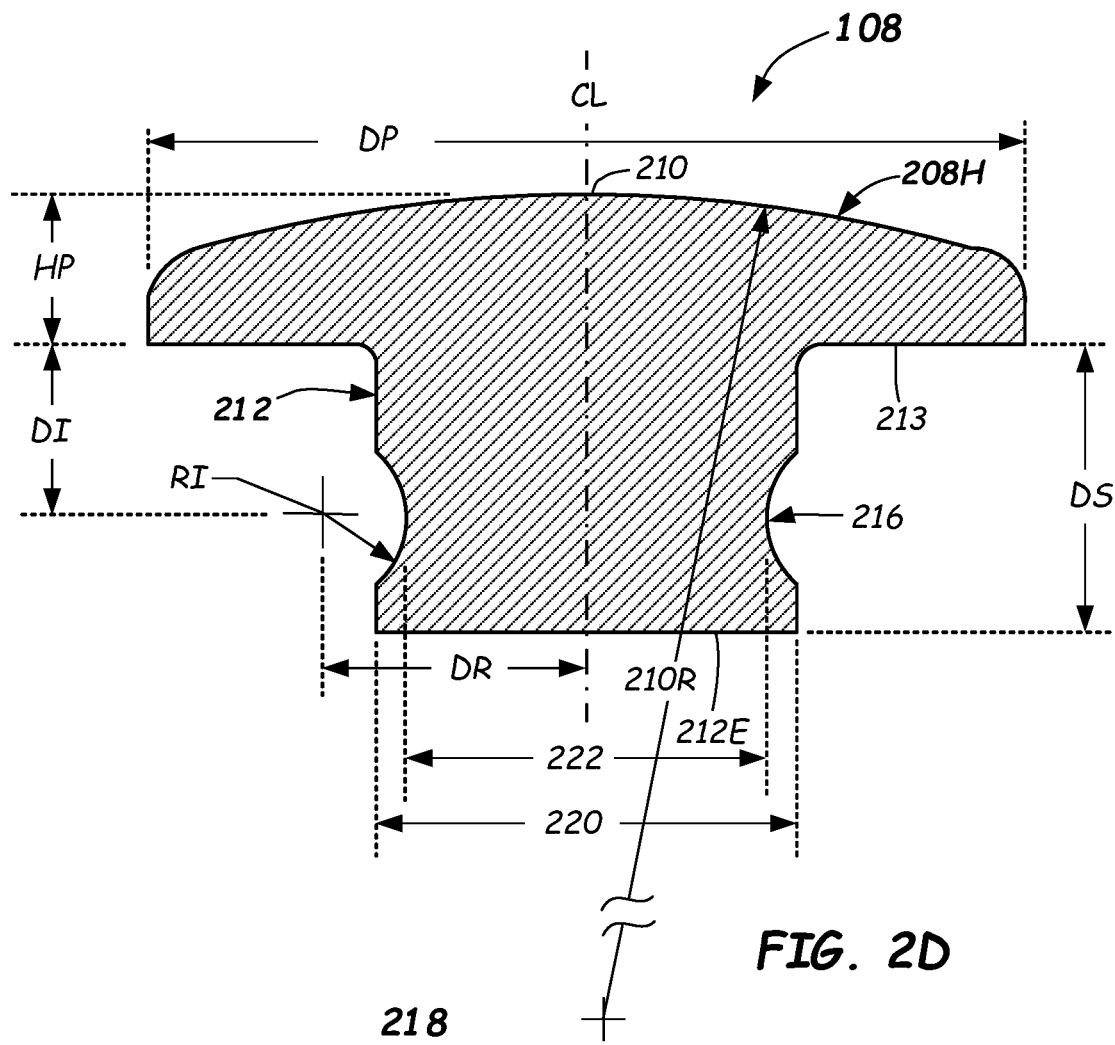
FIG. 2D illustrates a cross-sectional side view of an example contact pad body of the replaceable contact pad in accordance with some embodiments of the present disclosure.
Figure 3A:
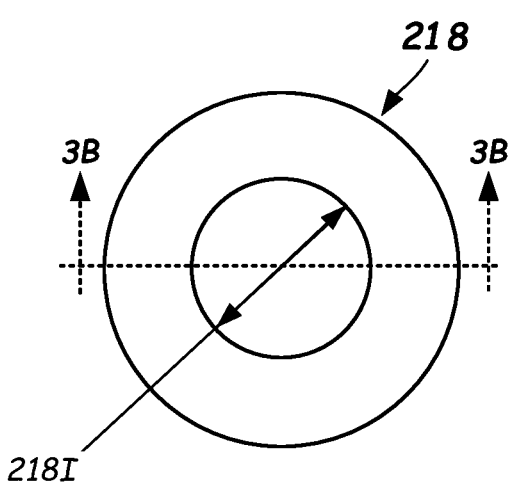
FIG. 3A illustrates a top plan view of a circular securing member of FIG. 2A comprising an O-ring in accordance with some embodiments of the present disclosure.
Figure 3B:
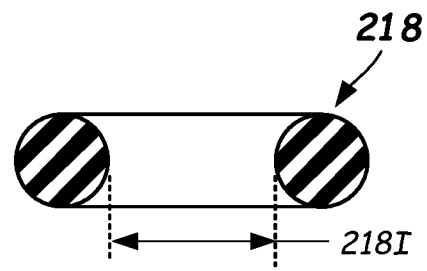
FIG. 3B illustrates a cross-sectional side view of the circular securing member of FIG. 3A taken along section 3B-3B of FIG. 3A and comprising an O-ring of the replaceable contact pad in accordance with some embodiments of the present disclosure.

The shaft indent 116 may include a surface contour with an arcuate bottom of a common bottom radius RI (FIG. 2D). A minimum dimension 222 (e.g., minimum diameter) of the shaft 212 can be positioned at a distance DI from the underside 213 of the contact pad head 208H. The radius RI can be from 0.59 mm to 1.2 mm, for example. The distance DI can be from 1.2 mm to 1.9 mm, for example. The radius center can be positioned at a distance DR of from 1.7 mm to 2.9 mm, for example. Other dimensions for the radius RI, the distance DI, and the distance DR, can be used depending on the size of the circular securing member 218 used.

The circular securing member 218 is received around the shaft 212 and is seated in the shaft indent 216 to secure the contact pad 108 to the end effector body 102. When the circular securing member 218 is seated in the shaft indent 216, the circular securing member 218 contacts a seating surface 214S of the recess 214 and also at least a part of the shaft indent 216. In the depicted embodiment, the circular securing member 218 comprises an O-ring that is compressed against the seating surface 214S in the as-installed condition. The O-ring may be manufactured from an elastomer material, such as a perfluoroelastomer available as KALREZ® from DUPONT PERFORMANCE ELASTOMERS, copolymers of hexafluoropropylene (HFP) and vinylidene fluoride (VDF or VF2) and available as VITON® from The Chemours Company, or any other suitable high-temperature elastomer. O-rings of elastomer may be used up to about 316° C.

The size of the shaft indent 216 by virtue of the indent radius RI, location of the shaft indent 216 by virtue of the distance DI, and the size of the circular securing member 218 can be selected such that a securing force enabling the secure clamping of the underside 213 of the contact pad head 208H to the top surface 102T is provided. A clamping force of from 0.5 lb. to 5.0 lb. or more could be achieved, for example. The circular securing member 218 can comprise an inner dimension 218I (e.g., inside diameter) that is less than an outside diameter 220 of the shaft 212 (FIG. 2D) so that the circular securing member 218 can be retained on the shaft 212 in the shaft indent 216. Moreover, the circular securing member 218 can comprise an inner dimension 218I (e.g., inside diameter) that is less than a minimum diameter 222 of the shaft indent 216 to provide a secure fit therein. The outside diameter 220 of the shaft 212 can be from 2.9 mm to 5.7 mm, for example. The minimum diameter 222 of the shaft indent 216 can be from 2.2 mm to 4.5 mm, for example. Other dimensions for the outside diameter 220 and the minimum diameter 222 can be used.

In some embodiments, the contact pad 108 can be made up of, or include, an electrically-conductive material, such as an electrically-conductive ceramic or a metal. For example, the contact pad 108 can be manufactured from an electrically-conductive ceramic material. A metal-doped ceramic can be used where electrical conductivity is sought. Any suitable metal-doped ceramic, such as Ti-doped alumina, can be a good choice for high temperature applications where electrical conductivity is sought. Silicon carbide or doped silicon carbide may also be used.

Optionally, the contact pad 108 may be made from a metal, such as stainless steel, aluminum, nickel-plated aluminum, or other low-conductivity ceramics such as zirconia, alumina, and the like. Where electrical conductivity is sought, the conductivity of the contact pad 108 should be sufficient to act as part of a ground path through the end effector body 102 to ground any static charge on the substrate 101 supported thereon.

As shown in FIG. 2A, the top surface 102T comprises a spot face raised from an underlying planar surface 102PS of the end effector body 102. The spot faces provide a plane upon which the contact pads 108 sit. The spot faces can be circular and about the size of the contact pad diameter DP of the contact pad head 108H or larger. Other shapes and sizes can be used. In the depicted embodiment, the top surface 102T can be spaced a raised distance DF from the underlying planar surface 102PS. The distance DF can be from 1.92 mm to 3.8 mm, for example. The raised distance DF can provide a sufficient amount of material for support of the contact pad 108 and avoid cracking thereof. Other distances DF can be used.

FIGS. 4A-4C illustrate an alternative embodiment of end effector 400 adapted to support a substrate 101 and including one or more replaceable ones of the contact pads 408. For example, three contact pads 408 can be applied to the end effector body 102 in the same manner as contact pads 108. In particular, the end effector body 102 is the same as heretofore described, but the contact pads 408 as shown in FIGS. 4A-4C are configured for high temperature use, such as between 250° C. and 650° C., or above 320° C., for example. This embodiment of end effector 400 is configured to support a substrate 101 and comprises an end effector body 102 having a top surface 102T and a bottom surface 102B, a recess 214 extending into the end effector body 102 from the bottom surface 102B, and an aperture 215 formed in the end effector body 102 and extending between the top surface 102T and the recess 214, as previously described.

The contact pad 408 disposed on the end effector body 102 comprises a contact pad head 208H having a contact surface 210 configured to contact the substrate 101 as heretofore described, and a shaft 412 coupled to the contact pad head 208H and that is received in the aperture 215 and extends into the recess 214. The shaft 412 includes a shaft indent 416 formed between an underside 213 of the contact pad head 208H and a shaft end 412E. The shaft indent 416 can include any suitable shape, such as including conical sides and cylindrical bottom shown.

A circular securing member 418 is received around the shaft 412 and seated in the shaft indent 416 to secure the contact pad 408 to the end effector body 102. As shown in FIGS. 4B and 4C, the circular securing member 418 can comprise a circular body 418B with a cut 418C, such as radial cut shown. The circular body 418B can be manufactured from a rigid material, such as metal. In particular, the material should be a metal that can withstand sustained operation above 250° C., above 320° C., or even from 250° C. and 650° C., for example. Because the circular securing member 418 can act at least in part as a spring, the circular securing member 418 can be made from a very high tensile strength material, such as music wire or 17-4PH steel. The inner diameter 418I of the circular body 418B is smaller than the outside diameter 220 of the shaft 412. The inner diameter 418I and maximum dimension 418D of the circular securing member 418 can be selected to produce a clamping force between the circular securing member 418 and the underside 213 of the contact pad head 208H. Thus, as installed, the circular securing member 418 can be provided in an expanded condition as seated in the indent 416, i.e., wherein the cut 418C is made larger than in its fee condition shown in FIG. 4B.

Figure 5A:
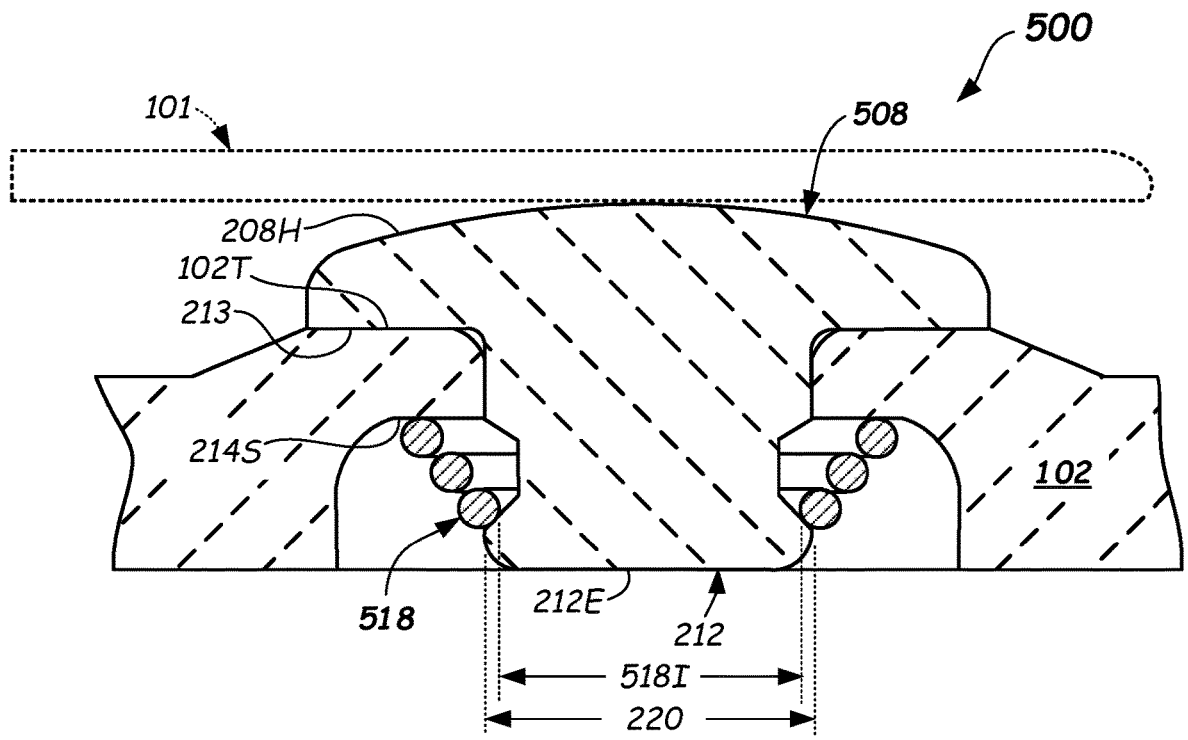
FIG. 5A illustrates a cross-sectional side view of a portion of an end effector including a example replaceable contact pad adapted for high temperature operation above 320° C. in accordance with an alternative embodiment of the present disclosure.
Figure 5B:
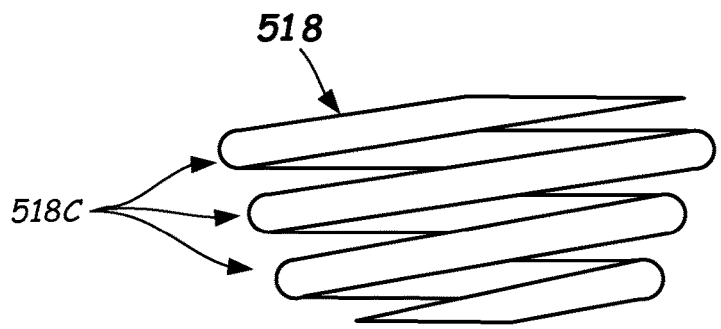
FIG. 5B illustrates a side plan view of a circular securing member comprising a conical coil spring of FIG. 5A in accordance with alternative embodiments of the present disclosure.

FIGS. 5A and 5B illustrate another embodiment of end effector 500 including one or more replaceable ones of the contact pad 508 that is configured to withstand high temperature use, such as sustained operation above 250° C., from 250° C. to 650° C., or even above 320° C., for example. The only difference between the embodiment of FIG. 4A and the embodiment of FIG. 5A is the configuration of the circular securing member 518. In this embodiment, the circular securing member 518 comprises a coil spring, such as the conical coil spring shown. The circular securing member 518 can include a plurality of coils 518C, such as helical coils shown. In the case of a conical coil spring, the coils 518C can comprise coils of both smaller and larger diameters. The lowest coil with a smallest inner diameter 518I is smaller than a maximum outside diameter 220 of the shaft 212. Thus, as installed, the circular securing member 518 comprising a coil spring is provided in a compressed state so as to exert a clamping force drawing the underside 213 of the contact pad head 108H into secure clamped engagement with the top surface 102T. The spring rate of the circular securing member 518 comprising a coil spring can be selected to achieve a certain clamping force, such as 0.5 lb. or more (e.g., 0.5 lb. to 5 lb. or more).

To install the various circular securing members 218, 418, 518 to the shaft 212, the smaller inner dimensions of the members can be snapped over the larger outside diameter 220 of the shaft end 212E, such as with the aid of a suitable assembly tool. In each case, the flexibility of the circular securing members 218, 418, 518 allows the smaller inner dimension 218I, 418I, 518I to expand over the larger dimension and then to seat the circular securing members 218, 418, 518 in the respective shaft indent 216, 416 (e.g., groove). As shown in FIGS. 4A and 5A, the shaft end 212E can include a radius or taper to aid in snapping the circular securing members 218, 418, 518 over the shaft 212.

Figure 6:
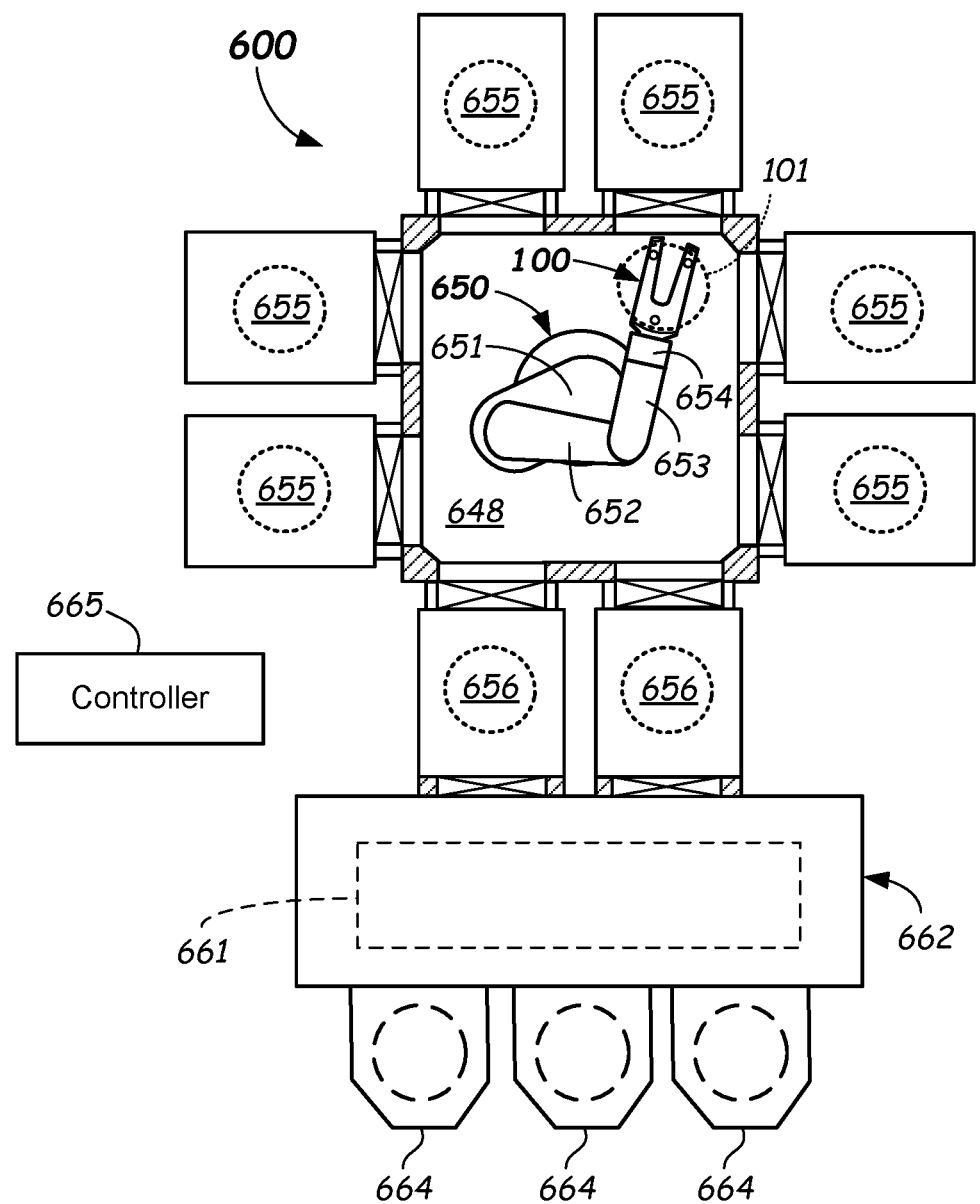
FIG. 6 illustrates a top schematic view of an electronic device manufacturing apparatus including a transfer robot having an end effector including replaceable contact pads provided in accordance with one or more embodiments of the present disclosure.

FIG. 6 illustrates an example embodiment of an electronic device manufacturing apparatus 600 including a transfer chamber robot 650 having an end effector 100 supporting a substrate 101 (shown dotted for illustration purposes) wherein the substrate 101 is supported on replaceable contact pads as described herein. The electronic device manufacturing apparatus 600 may include a number of processing chambers 655 (shown dotted) coupled to a transfer chamber 648. The transfer chamber 648 may house the transfer chamber (TC) robot 650. The TC robot 650 may have a first arm 651, a second arm 652, and a third arm 653 (e.g., a robot wrist). The end effector 100 is coupled to the third arm 653, such as through mounting plate 654. The end effector 100 may contact and support a substrate 101 thereon (e.g., a semiconductor wafer, glass plate, etc.).

The transfer chamber 648 of the processing tool 600 may be connected, via one or more load lock chambers 656, to a factory interface 662. The factory interface 662 may house a factory interface (FI) robot 661. The FI robot 661 may include an end effector (not shown, but substantially identical to end effector 100) and that can have replaceable ones of the contact pads 108, 408, 508 as described herein.

Substrate carriers 664 may be detachably connected to a front wall of the factory interface 662 and substrates 101 therein may be moved by the FI robot 661 between the substrate carriers 664 and the one or more load lock chambers 656.

The processing tool 600 may be coupled to a controller 665. The controller 665 may control movement of the substrates 101 and processing thereof. The controller 665 may include a central processing unit (CPU), support circuits, and a memory, for example. In operation, the TC robot 650 may be operated, subject to commands from the controller 665, to move substrates 101 between the various process chambers 655 and the load lock chambers 656 or between different process chambers 655, for example.

As the manufacturing processes progress, the FI robot 661 and the TC robot 650, working in tandem, may move substrates 101 between the substrate carriers 664 and the processing chambers 655. Various electronic device fabrication processes, e.g., semiconductor device manufacturing processes, such as, e.g., oxidation, thin film deposition, etching, heat treatment, degassing, cool down, etc., may take place within the process chambers 655.

Because it may be desirable for substrates 101 to be moved as quickly as possible to speed up the manufacturing process and, consequently, to reduce manufacturing costs, some wear on the contact pads 108, 408, 508 can result, due to motion, placement, misalignment correction, and the like. Thus, it may be desirable at times, such as after a number of hours of use or other measure, to replace the end effectors 100, 400, 500 in a maintenance operation.

Figure 7:
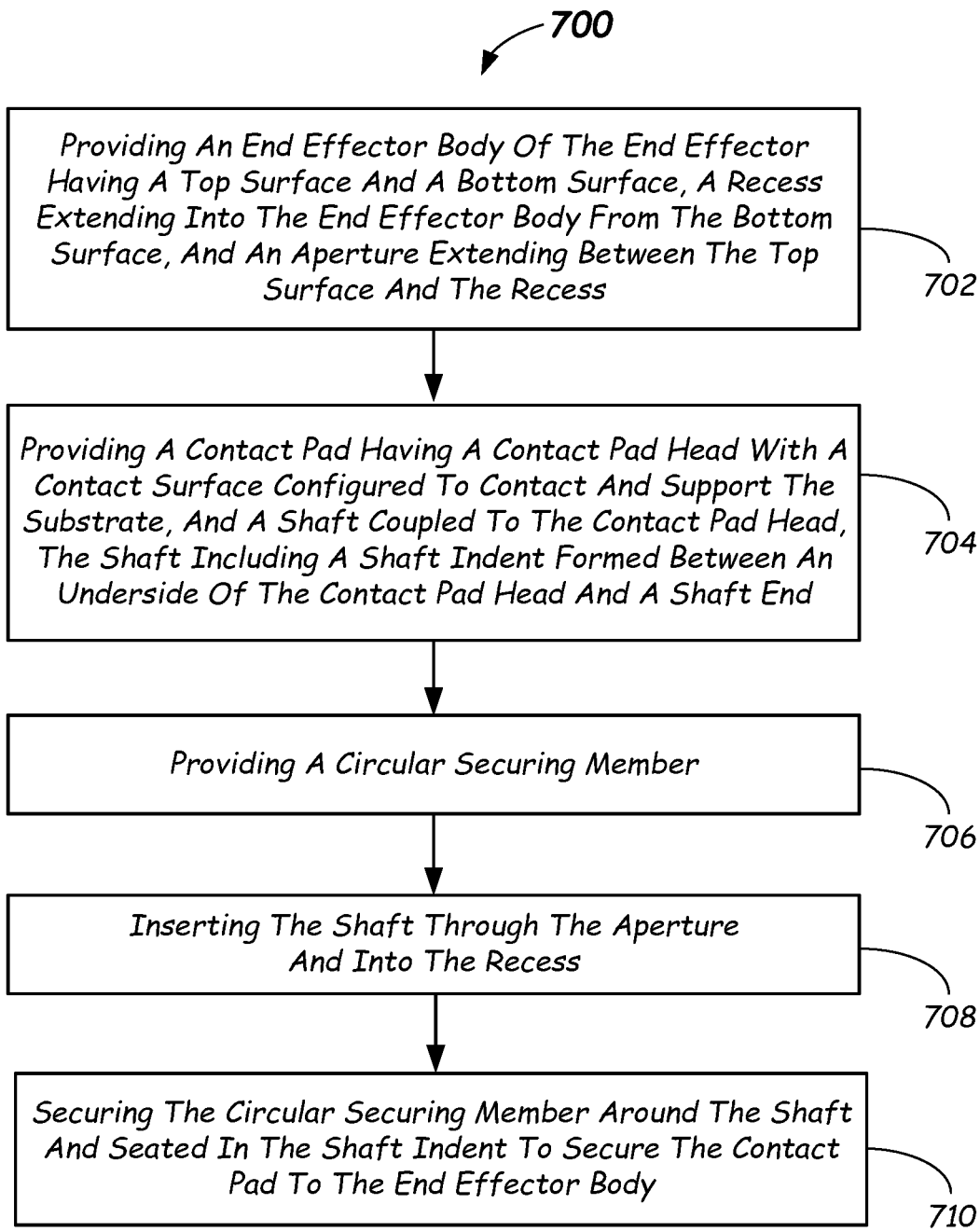
FIG. 7 illustrates a flowchart of a method of maintenance of an end effector provided in accordance with one or more embodiments of the present disclosure.

FIG. 7 illustrates a flowchart of a method of maintaining an end effector (e.g., end effector 100, 400, 500 and the like) that is adapted to transport a substrate (e.g., substrate 101) in electronic device manufacturing (e.g., in electronic device manufacturing apparatus 600 and the like). The method 700 includes, in block 702, providing an end effector body (e.g., end effector body 102) of the end effector (e.g., end effector 100, 400, 500, and the like) having a top surface (e.g., top surface 102T) and a bottom surface (e.g., bottom surface 102B), a recess (e.g., recess 214) extending into the end effector body (e.g., end effector body 102) from the bottom surface (e.g., bottom surface 102B), and an aperture (e.g., aperture 215) extending between the top surface (e.g., top surface 102T) and the recess (e.g., recess 214).

The method 700 further includes, in block 704, providing a contact pad (e.g., contact pad 108, 408, 508 and the like) having a contact pad head (e.g., contact pad head 208H) with a contact surface (e.g., contact surface 210) configured to contact and support the substrate (e.g., substrate 101 and the like), and a shaft (e.g., shaft 212) coupled to the contact pad head (e.g., contact pad head 208H), the shaft (e.g., shaft 212) including a shaft indent (e.g., shaft indent 216) formed between an underside (e.g., underside 213) of the contact pad head (e.g., contact pad head 208H) and a shaft end (e.g., shaft end 212E).

The method 700 further includes, in block 706, providing a circular securing member (e.g., circular securing member 218, 418, 518, and the like), in block 708, inserting the shaft (e.g., shaft 212) through the aperture (e.g., aperture 215) and into the recess (e.g., recess 214), and, in block 710, securing the circular securing member (e.g., circular securing member 218, 418, 518 and the like) around the shaft (e.g., shaft 212) and seated in the shaft indent (e.g., shaft indent 216) to secure the contact pad (e.g., contact pad 108, 408, 508) to the end effector body (e.g., end effector body 102).

The foregoing description discloses example embodiments of the disclosure. Modifications of the above-disclosed contact pad apparatus, end effector apparatus, and maintenance methods which fall within the scope of this disclosure will be readily apparent to those of ordinary skill in the art. Accordingly, it should be understood that other embodiments may fall within the scope of the disclosure, as defined by the following claims.

What is claimed is:

1. An end effector configured to support a substrate, comprising:
    an end effector body having a top surface and a bottom surface, a recess extending into the end effector body from the bottom surface and an aperture formed in the end effector body and extending between the top surface and the recess;
    a contact pad disposed on the end effector body, the contact pad further comprising a contact pad head having a contact surface configured to contact the substrate, and a shaft coupled to the contact pad head and received in the aperture and extending into the recess, the shaft including a shaft indent formed between an underside of the contact pad head and a shaft end; and
    a circular securing member of a circular shape that encircles the shaft and is seated in the shaft indent to secure the contact pad to the end effector body, wherein the circular securing member is configured to provide a securing force enabling secure clamping of the underside of the contact pad head to the top surface of the end effector body.

2. The end effector of claim 1, wherein the contact surface comprises a domed shape having a radius of curvature of from 8 mm to 20 mm.

3. The end effector of claim 1, wherein the contact surface has a surface roughness of from 45 µin Ra to 65 µin Ra.

4. The end effector of claim 1, wherein the contact pad comprises an electrically-conductive material.

5. The end effector of claim 4, wherein the contact pad comprises an electrically-conductive material chosen from a group consisting of a metal-doped ceramic, silicon carbide, stainless steel, aluminum, and nickel-plated aluminum.

6. The end effector of claim 1, consisting essentially of three contact pads of Ti-doped alumina.

7. The end effector of claim 1, wherein the shaft indent comprises an annular groove.

8. The end effector of claim 7, wherein the annular groove comprises a surface contour with a common bottom radius.

9. The end effector of claim 1, wherein when the circular securing member is seated in the shaft indent, the circular securing member contacts a seating surface of the recess.

10. The end effector of claim 9, wherein when the circular securing member is compressed against the seating surface.

11. The end effector of claim 1, wherein the circular securing member comprises an elastomer O-ring.

12. The end effector of claim 11, wherein the circular securing member comprises a perfluoroelastomer.

13. The end effector of claim 1, wherein the circular securing member comprises an inside diameter that is less than an outside diameter of the shaft.

14. The end effector of claim 1, wherein the circular securing member comprises an inside diameter that is less than a minimum diameter of the shaft indent.

15. The end effector of claim 1, wherein the top surface comprises a spot face raised from an underlying planar surface of the end effector body.

16. The end effector of claim 1, wherein the circular securing member comprises a cut metal ring.

17. The end effector of claim 1, wherein the circular securing member comprises a coil spring.

18. The end effector of claim 1, wherein the circular securing member comprises a conical coil spring.

19. A contact pad adapted to be secured to an end effector body of an end effector, comprising:
    a contact pad head having a contact surface configured to contact a substrate;
    a shaft coupled to the contact pad head, the shaft including a shaft indent formed between an underside of the contact pad head and a shaft end; and
    a circular securing member of a circular shape that encircles the shaft and is seated in the shaft indent and configured to secure the contact pad to the end effector body, wherein the circular securing member is configured to provide a securing force enabling secure clamping of the underside of the contact pad head to a top surface of the end effector body.

20. A method of maintaining an end effector adapted to transport a substrate in electronic device manufacturing, comprising:
    providing an end effector body of the end effector having a top surface and a bottom surface, a recess extending into the end effector body from the bottom surface, and an aperture extending between the top surface and the recess;
    providing a contact pad having a contact pad head with a contact surface configured to contact and support the substrate, and a shaft coupled to the contact pad head, the shaft including a shaft indent formed between an underside of the contact pad head and a shaft end;
    providing a circular securing member;
    inserting the shaft through the aperture and into the recess; and
    securing the circular securing member of a circular shape that encircles the shaft and is seated in the shaft indent to secure the contact pad to the end effector body,
    wherein the circular securing member is configured to provide a securing force enabling secure clamping of the underside of the contact pad head to the top surface of the end effector body.

* * * * *